United States Patent
Akasaka

(10) Patent No.: US 7,285,461 B2
(45) Date of Patent: Oct. 23, 2007

(54) SEMICONDUCTOR DEVICE AND METHOD OF MANUFACTURING THE SAME

(75) Inventor: Yasushi Akasaka, Tsuchiura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 11/213,957

(22) Filed: Aug. 30, 2005

(65) Prior Publication Data

US 2006/0011950 A1    Jan. 19, 2006

Related U.S. Application Data

(62) Division of application No. 10/458,489, filed on Jun. 11, 2003, now Pat. No. 6,956,259.

(30) Foreign Application Priority Data

Jun. 13, 2002 (JP) .............................. 2002-172629

(51) Int. Cl.
*H01L 21/8242* (2006.01)
(52) U.S. Cl. ...................................... 438/243; 438/244
(58) Field of Classification Search ................ 438/243, 438/244; 257/301, 303
See application file for complete search history.

(56) References Cited

U.S. PATENT DOCUMENTS

| | | | |
|---|---|---|---|
| 5,719,410 A | 2/1998 | Suehiro et al. | |
| 5,905,279 A | 5/1999 | Nitayama et al. | |
| 6,100,193 A | 8/2000 | Suehiro et al. | |
| 6,133,150 A | 10/2000 | Nakajima et al. | |
| 6,306,756 B1 | 10/2001 | Hasunuma et al. | |
| 6,326,658 B1 | 12/2001 | Tsunashima et al. | |
| 6,660,535 B2 | 12/2003 | Basceri et al. | |
| 6,956,259 B2 * | 10/2005 | Akasaka | 257/301 |
| 2002/0056874 A1 | 5/2002 | Ohtake et al. | |
| 2002/0081862 A1 | 6/2002 | Rotonadaro | |
| 2003/0060059 A1 | 3/2003 | Summerfelt | |

FOREIGN PATENT DOCUMENTS

| | | |
|---|---|---|
| JP | 04-049654 | 2/1992 |
| JP | 9-312270 | 12/1997 |
| JP | 2000-164824 | 6/2000 |
| JP | 2001-168322 | 6/2001 |
| JP | 2002-033461 | 1/2002 |

OTHER PUBLICATIONS

Notification of Reasons for Rejection from the Japanese Patent Office, mailed Sep. 5, 2006, in Japanese Patent Application No. 2002-172629, and English translation thereof.

* cited by examiner

*Primary Examiner*—Mark V. Prenty
(74) *Attorney, Agent, or Firm*—Finnegan, Henderson, Farabow, Garrett & Dunner, L.L.P.

(57) ABSTRACT

Disclosed is a semiconductor device comprises a semiconductor substrate having on its surface a trench, a polycrystalline semiconductor film formed inside the trench, a diffusion layer deposited on a surface region of the semiconductor substrate, and a metal semi-conductor nitride layer interposed between the diffusion layer and the polycrystalline semiconductor film, the metal semiconductor nitride layer including a metal, nitrogen and a semiconductor constituting the semiconductor substrate, and electrically connecting the polycrystalline semiconductor film with the diffusion layer.

13 Claims, 4 Drawing Sheets

SEMICONDUCTOR DEVICE AND METHOD OF MANUFACTURING THE SAME

CROSS-REFERENCE TO RELATED APPLICATIONS

This application is a divisional of Application Ser. No. 10/458,489, filed Jun 11, 2003, now U.S. Pat. No. 6,956,259, issued Oct. 18, 2005, the entire contents of which are incorporated herein by reference. Also, this application is based upon and claims the benefit of priority from the prior Japanese Patent Application No. 2002-172629, filed Jun. 13, 2002, the entire contents of which are incorporated herein by reference.

BACKGROUND OF THE INVENTION

1. Field of the Invention

This invention relates to a semiconductor device and a method for manufacturing the semiconductor device, and in particular, to a semiconductor device comprising a trench capacitor, and source/drain diffusion layer electrically connected with the trench capacitor, and a method for manufacturing such a semiconductor device.

2. Description of the Related Art

FIG. 1 shows a cross-sectional view of a DRAM cell having a trench capacitor according to the prior art. Referring to FIG. 1, reference numeral 81 denotes a monocrystalline p-type silicon substrate, 82 a trench capacitor, 83 a buried n-type well, 84 a p-type well, 85 n-type source/drain diffusion layer, 86 a gate insulating film, 87 a gate electrode, 88 an element-isolating insulating film, and 89 an insulating film.

The trench capacitor 82 is constituted by an n-type diffusion layer 90 (plate electrode), a capacitor insulating film 91 and an n-type polycrystalline silicon film 92 (storage node electrode).

On the n-type polycrystalline silicon film 92, there is deposited an n-type polycrystalline silicon film 93 which is directly connected with the n-type source/drain diffusion layer 85. Namely, the trench capacitor 82 is electrically connected with the n-type source/drain diffusion layer 85 through the n-type polycrystalline silicon film 93 functioning as a connecting portion.

Since the n-type source/drain diffusion layer 85 is monocrystalline, there is a possibility that the n-type polycrystalline silicon film 93 epitaxially grows with the source/drain diffusion layer 85 being utilized as a seed crystal during a heating step in the DRAM process. This heating step is performed in a step of forming a passivation film subsequent to the steps of forming the trench capacitor 82 and an MOS transistor for instance.

If the n-type polycrystalline silicon film 93 epitaxially grows in this manner, stress is caused to generate inside the resultant semiconductor elements, thereby giving rise to the generation of crystal defects inside the substrate. The crystal defects of this kind may become a cause for the generation of a leak current. The quantity of electric charge stored in the capacitor generally decrease as the degree of integration of a DRAM increases. Therefore, the generation of the aforementioned leak current cannot be disregarded particularly in the case of a highly integrated DRAM which will be going to be developed from now on.

As one of the means for preventing the generation of the aforementioned leak current, it may be conceivable to employ a DRAM cell as shown in FIG. 2. The DRAM cell shown in FIG. 2 is featured in that the n-type polycrystalline silicon film 93 is indirectly connected via a silicon nitride film 94 with the source/drain diffusion layer 85. As a result, due to the presence of the silicon nitride film 94 functioning as a barrier, the source/drain diffusion layer 85 is no longer capable of functioning as a seed crystal, thus making it possible to prevent the n-type polycrystalline silicon film 93 from being epitaxially grown.

Since the silicon nitride film 94 is one kind of insulating film, this silicon nitride film 94 is required to be extremely thin in order to sufficiently secure an electric connection between the n-type polycrystalline silicon film 93 and the source/drain diffusion layer 85.

However, even if it is possible to make the silicon nitride film 94 extremely thin, the silicon nitride film 94 is still permitted to function as an insulating film, so that it is impossible to avoid an increase of contact resistance between the trench capacitor 82 and the source/drain diffusion layer 85.

As mentioned above, in the case of the conventional DRAM cell having a trench capacitor, the trench capacitor is electrically connected, via an n-type polycrystalline silicon film or an n-type polycrystalline silicon film/silicon nitride film, with source/drain diffusion layer.

In the case of the former, due to the epitaxial growth of the n-type polycrystalline silicon film (storage node electrode) constituting a trench capacitor, a stress, which is a cause of a leak current generates inside the resultant semiconductor elements, thus causing the generation of a leak current. On the other hand, in the case of the latter, it would be impossible to prevent an increase in contact resistance between the n-type polycrystalline silicon film and the source/drain diffusion layer.

BRIEF SUMMARY OF THE INVENTION

A semiconductor device according to one embodiment of the present invention comprises:

a semiconductor substrate having on its surface a trench;

a polycrystalline semiconductor film formed inside the trench;

a diffusion layer deposited on a surface region of the semiconductor substrate; and a metal semiconductor nitride layer interposed between the diffusion layer and the polycrystalline semiconductor film, the metal semiconductor nitride layer including a metal, nitrogen and a semiconductor constituting the semiconductor substrate, and electrically connecting the polycrystalline semiconductor film with the diffusion layer.

A semiconductor device according to another embodiment of the present invention comprises:

a semiconductor substrate having on its surface a trench;

a first polycrystalline semiconductor film deposited in the trench in such a degree that the trench is not completely filled with the first polycrystalline semiconductor film up to the top of opening of the trench;

a second polycrystalline semiconductor film deposited on the first polycrystalline semiconductor film formed inside the trench;

a first diffusion layer deposited on a surface region of the semiconductor substrate; and a metal semiconductor nitride layer interposed between the first diffusion layer and the second polycrystalline semiconductor film, wherein the metal semiconductor nitride layer includes a metal, nitrogen and a semiconductor constituting the semiconductor substrate, and electrically connecting the first diffusion layer with the second polycrystalline semiconductor film.

A method of manufacturing a semiconductor device according to one embodiment of the present invention comprises:

forming a trench on a surface of a substrate;

filling the trench with a first polycrystalline semiconductor film in such a degree that the trench is not completely filled with the first polycrystalline semiconductor film up to the top of opening of the trench;

depositing a metal nitride film to cover a portion of sidewall of the trench which is not yet filled with the first polycrystalline semiconductor film;

heat-treating the sidewall of the trench and the metal nitride film which is contacted with the sidewall to permit a reaction to take place between them to convert the metal nitride film contacting with the sidewall of the trench into a metal semiconductor nitride layer comprising metal and nitrogen included in the metal nitride film, and a semiconductor constituting the semiconductor substrate;

removing the metal nitride film while permitting the metal semiconductor nitride layer to be left remain;

depositing a second polycrystalline semiconductor film in the trench; and forming a diffusion layer on a surface region of the substrate, the diffusion layer being electrically connected, via the metal semiconductor nitride layer, with the second polycrystalline semiconductor film.

A method of manufacturing a semiconductor device according to another embodiment of the present invention comprises:

forming a trench on a surface of a substrate;

depositing an insulating film to cover a sidewall and bottom of the trench;

filling the trench with a first polycrystalline semiconductor film in such a degree that the trench is not completely filled with the first polycrystalline semiconductor film up to the top of opening of the trench;

removing a portion of the insulating film covering a portion of the sidewall of the trench which is not buried by the first polycrystalline semiconductor film;

depositing a metal nitride film to cover a portion of sidewall of the trench which has been exposed due to the removal of the insulating film;

heat-treating the sidewall of the trench and the metal nitride film which is contacted with the sidewall to permit a reaction to take place between them to convert the metal nitride film contacting with the sidewall of the trench into a metal semiconductor nitride layer comprising metal and nitrogen included in the metal nitride film, and a semiconductor constituting the semiconductor substrate;

removing the metal nitride film while permitting the metal semiconductor nitride layer to be left remain;

depositing a second polycrystalline semiconductor film in the trench; and forming a first diffusion layer on a surface region of the substrate, the first diffusion layer being electrically connected, via the metal semiconductor nitride layer, with the second polycrystalline semiconductor film.

DETAILED DESCRIPTION OF THE INVENTION

According to the embodiments of the present invention, a polycrystalline semiconductor film formed inside a trench is electrically connected, through a metal semiconductor nitride layer, with a diffusion layer which is formed on the surface region of a semiconductor substrate. Further, since this metal semiconductor nitride layer is enabled to function as a barrier, it is possible to prevent the polycrystalline semiconductor film from generating the epitaxial growth thereof with the diffusion layer being utilized as a seed crystal in a heating step thereof. Further, since the metal semiconductor nitride layer contains a metal, any increase in contact resistance between the polycrystalline semiconductor film and the diffusion layer can be prevented.

Next, the embodiments of the present invention will be explained with reference with the drawings.

Figure 1:
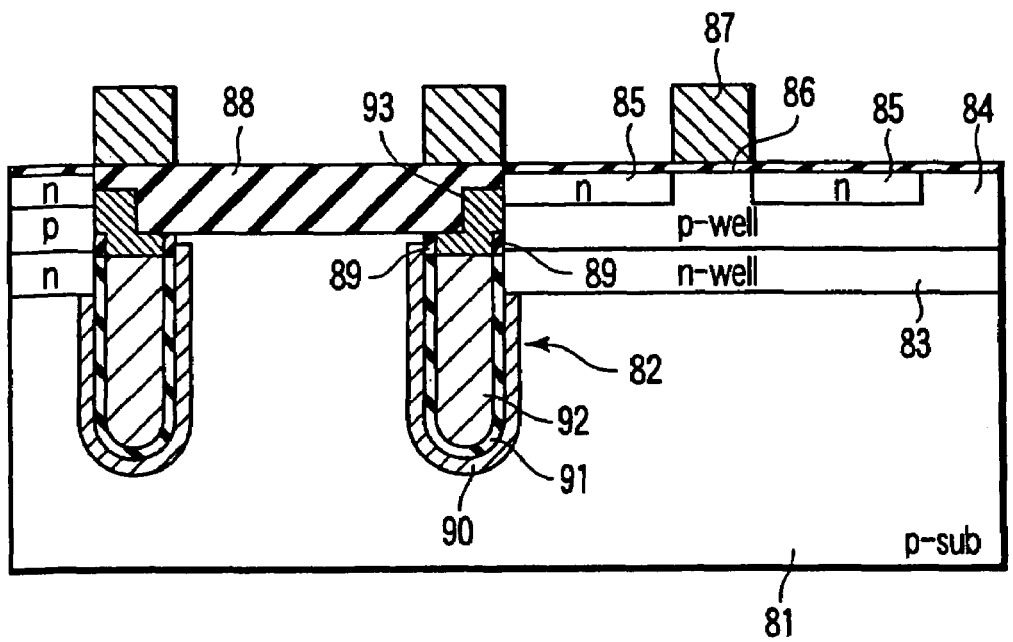
FIG. 1 shows a cross-sectional view illustrating a DRAM cell having a trench capacitor according to the prior art.
Figure 2:
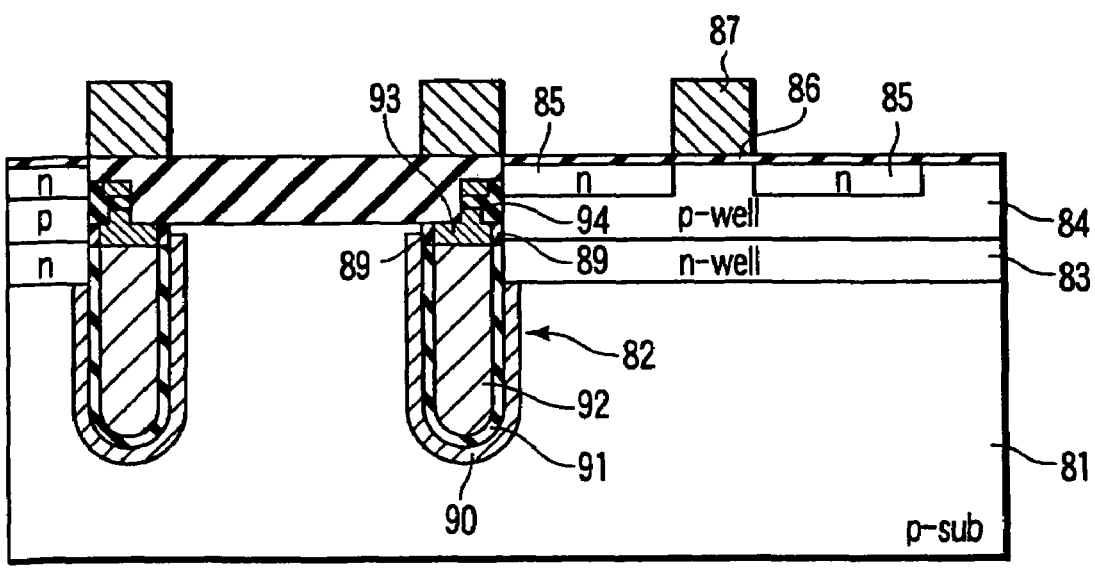
FIG. 2 is a cross-sectional view illustrating a DRAM cell having a trench capacitor according to the prior art.
Figure 3A:
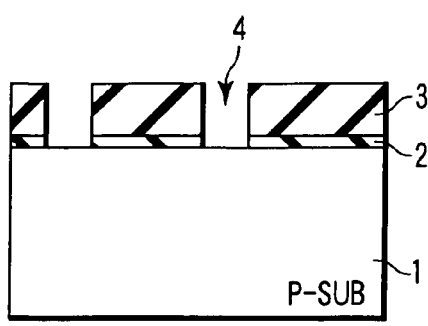
FIGS. 3A to 3S respectively shows a cross-sectional view illustrating the manufacturing steps of a DRAM cell having a trench capacitor according to a first embodiment of the present invention.
Figure 3B:
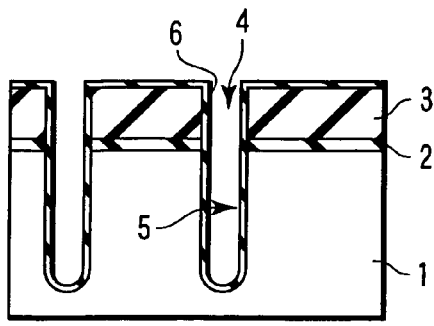
Figure 3C:
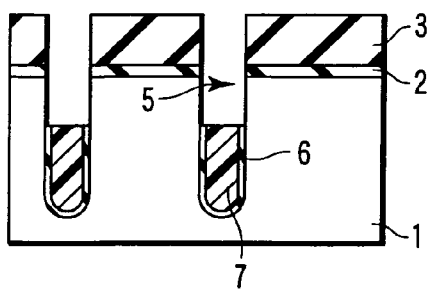
Figure 3D:
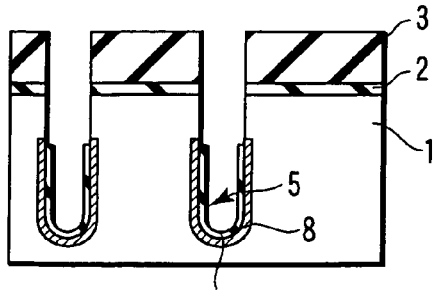
Figure 3E:
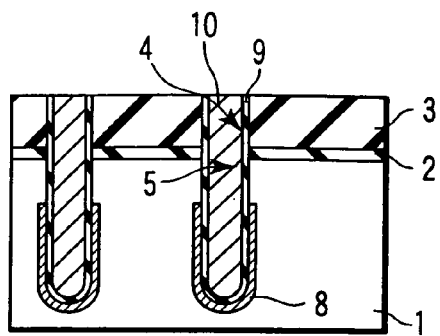
Figure 3F:
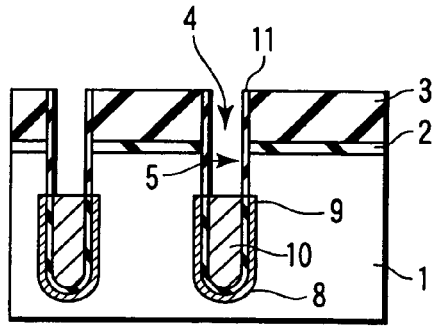
Figure 3G:
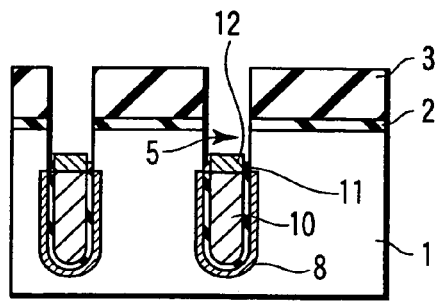
Figure 3H:
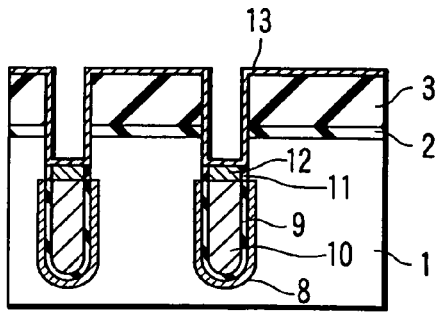
Figures 3I, 3J, 3K, 3L, 3M, 3N, 3O:
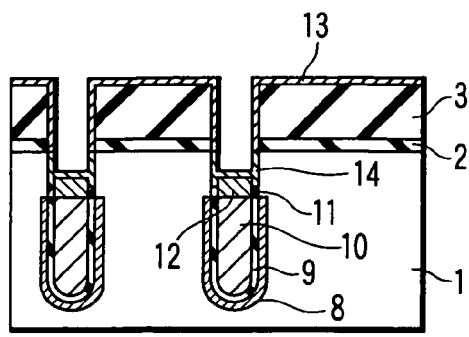
Figure 3P:
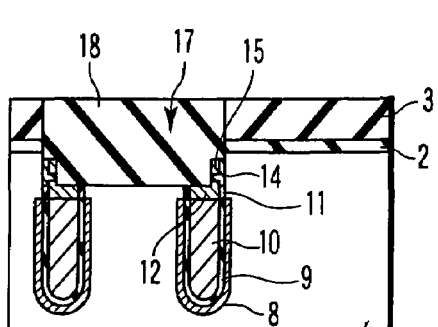
Figure 3Q:
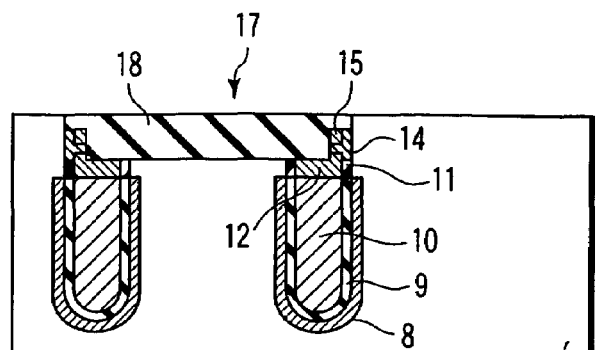
Figure 3R:
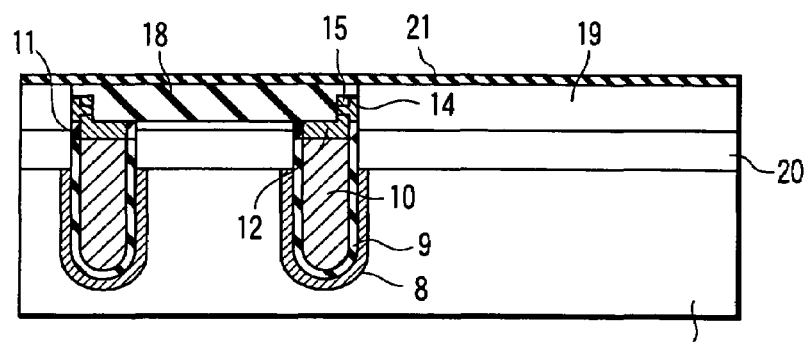
Figure 3S:
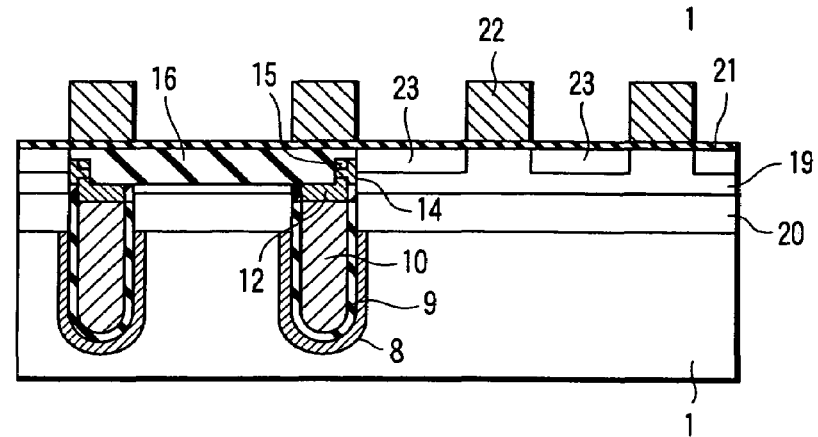

FIGS. 3A to 3S respectively shows a cross-sectional view illustrating the manufacturing steps of a DRAM cell according to a first embodiment of the present invention.

First of all, as shown in FIG. 3A, a thin silicon oxide film 2 is formed on the surface of a monocrystalline p-type silicon substrate 1 by thermal oxidation. Thereafter, a silicon nitride film ($Si_3N_4$ film) 3 having a thickness of about 20 nm is deposited on the silicon oxide film 2. Then, by photolithography and etching such as RIE, openings 4 are formed at predetermined regions of the silicon oxide film 2 and the silicon nitride film 3 where a trench for a trench capacitor is designed to be formed.

Then, as shown in FIG. 3B, by using the silicon nitride film 3 as a mask, the p-type silicon substrate 1 is subjected to anisotropic etching work using RIE, etc. to form trenches 5, which is followed by the deposition of an AsSG film (As-containing silicate glass film) 6 all over the surface by LP-CVD process so as to cover the inner wall of the trenches 5 with the AsSG film 6.

Then, as shown in FIG. 3C, the trench 5 is filled, up to an intermediate depth thereof, with a resist film 7, and the AsSG film 6 is subjected to etching using a solution containing HF with the resist film 7 being employed as a mask. As a result, the portion of the AsSG film 6 that is not covered by the resist film 7 is removed. Subsequently, the resist film 7 is removed.

Then, as shown in FIG. 3D, by heat treatment, As included in the AsSG film 6 is permitted to diffuse into a region of the p-type silicon substrate 1 which is located neighboring on the inner wall (side wall and bottom) of the trench 5, thereby forming an n-type diffusion layer 8 for constituting the plate electrode of the trench capacitor. Subsequently, the AsSG film 6 is removed.

A capacitor insulating film 9 containing silicon nitride as a main component is formed so as to cover the inner wall of the trench 5, and an n-type polycrystalline silicon film 10 containing an n-type impurity such as phosphor and constituting a portion of the storage electrode of the trench capacitor is deposited to fill the interior of the trench 5 with the n-type polycrystalline silicon film 10. Then, the portion of the n-type polycrystalline silicon film 10 that is deposited outside the trench 5 is removed by a CMP (Chemical Mechanical Polishing) process, for instance, to obtain a structure as shown in FIG. 3E.

Then, as shown in FIG. 3F, the n-type polycrystalline silicon film 10 existing inside the opening 4 and the trench 5 is partially removed down to an intermediate portion thereof by etching. Then, the portion of the capacitor insulating film 9 that has been exposed due to the removal of the n-type polycrystalline silicon film 10 is removed by etching. Subsequently, a silicon oxide film (sidewall insulating film) 11 is deposited so as to cover the sidewalls of the exposed opening 4 and of the trench 5.

This silicon oxide film 11 can be formed by a so-called sidewall-leaving process. Namely, a silicon oxide film (SiO$_2$ film) to be employed as a sidewall insulating film is deposited all over the surface by an LP-CVD process so as to cover the sidewalls of the opening 4 and of the trench 5. Subsequently, by anisotropic etching such as RIE, this silicon oxide film is entirely etched away to remove the n-type polycrystalline silicon film 10 and the capacitor insulating film 9 to obtain the silicon oxide film 11 covering the exposed opening 4 and the sidewall of the trench 5. As for the sidewall insulating film, it is also possible to employ other kinds of insulating film.

Then, as shown in FIG. 3G, the trench 5 is filled, up to an intermediate depth thereof, with an n-type polycrystalline silicon film 12 employed for constituting a portion of storage node electrode. Thereafter, by using this n-type polycrystalline silicon film 12 as a mask, the silicon oxide film 11 is subjected to etching using a solution containing HF to remove the silicon oxide film which is deposited on a portion of the trench 5 which is not covered by the n-type polycrystalline silicon film 12 as well as on the sidewall of the opening 4. This FIG. 3G however shows a state wherein an upper portion of the silicon oxide film 11 which is covered by the n-type polycrystalline silicon film 12 is slightly etched away.

This n-type polycrystalline silicon film 12 can be formed by the following process for example. Namely, an n-type polycrystalline silicon film for forming the n-type polycrystalline silicon film 12 is deposited all over the surface so as to fill the interior of the trench 5 with the n-type polycrystalline silicon film 12. Then, this n-type polycrystalline silicon film is permitted to recess down to a desired level to obtain the n-type polycrystalline silicon film 12.

Thereafter, as shown in FIG. 3H, a thin tungsten nitride film (WN$_x$ film) 13 is deposited all over the surface so as to cover not only the sidewall of the trench which is not buried with the n-type polycrystalline silicon film 10, 12 but also the top surface of the n-type polycrystalline silicon film 12. In this case, the tungsten nitride film 13 may be deposited so as to completely cover at least the sidewall of the trench 5 where Si is exposed.

The deposition of this tungsten nitride film 13 may be performed by either the PVD method or the CVD method. The film thickness of this tungsten nitride film 13 may be as thin as about 5 nm at the thinnest region thereof. The concentration of nitrogen of the tungsten nitride film 13 should preferably be within the range of 10 to 30 atomic percent.

The resultant structure is subjected to a heat treatment at a temperature ranging from 450° C. to 1100° C. and in a non-oxidizing atmosphere such as a nitrogen atmosphere. This non-oxidizing atmosphere may be a hydrogen gas atmosphere, i.e. a reducing atmosphere. Further, the atmosphere of this heat treatment may be an inert gas atmosphere such as an argon atmosphere or may be a mixed gas atmosphere comprising nitrogen, argon and hydrogen.

By performing the heat treatment in this manner, a reaction is permitted to take place to some extent between the tungsten nitride film 13 and Si existing on the sidewall of the trench 5 which is contacted with the tungsten nitride film 13. As a result, as shown in FIG. 3I, the tungsten nitride film 13 which is contacted with the surface of the sidewall of the trench 5 is turned into an amorphous layer (WSiN layer) 14 containing W, Si and N.

According to a similar reaction to that mentioned above, the tungsten nitride film 13 located on the top surface of the n-type polycrystalline silicon film 12 is also turned into an amorphous WSiN layer 14. Since this amorphous WSiN layer 14 on the top surface of the n-type polycrystalline silicon film 12 is created unintentionally in the course of processing, this amorphous WSiN layer 14 is not necessarily required to be disposed.

According to the method mentioned above, the amorphous WSiN layer 14 having a thickness of about 1 nm can be formed with an excellent reproducibility. This WSiN layer 14 is formed through the redistribution of nitrogen from the tungsten nitride film 13 to the sidewall of the trench 5 as well as to the n-type polycrystalline silicon film 12.

Further, since this WSiN layer 14 includes an Si—N bond as well as W, the electric resistance of this WSiN layer 14 would be lower than that of a simple silicon nitride film.

Further, since the film structure of this WSiN layer 14 is amorphous, this WSiN layer 14 is enabled to function as a barrier which prevents the epitaxial growth of the n-type polycrystalline silicon film 12 in a subsequent heating step. Moreover, this WSiN layer 14 is very stable even if it is subjected to a heat treatment as high as 950° C. or more. Therefore, the effect of this WSiN layer 14 to prevent the epitaxial growth would not be dissipated even in a heat treatment of high temperatures.

The metal that can be included in the metal semiconductor nitride film comprising metal, silicon and nitrogen is not limited to tungsten (W) but may be selected from any kind of metal as long as it meets the following conditions. Namely, it is possible to employ a metal which exhibits a smaller degree of drop in Gibbs free energy on an occasion of forming a nitride thereof than a magnitude of drop in Gibbs free energy which silicon would exhibit on the occasion of forming a nitride thereof. For example, molybdenum (Mo) and chromium (Cr) can be suitably employed as the metal.

These metals can be kept in a more stable state in terms of energy if they exist in the form of a compound with silicon than in the case where they exist in the form of a compound with nitrogen. Therefore, it is possible to easily redistribute nitrogen into the sidewall of the trench 5 and into the n-type polycrystalline silicon film 12 from the tungsten nitride film 13 in the step of FIG. 3I. As a result, it is possible to reliably form the WSiN layer 14.

Then, as shown in FIG. 3J, by using H$_2$O$_2$, a mixed solution comprising H$_2$O$_2$ and H$_2$SO$_4$, a mixed solution comprising H$_2$O$_2$ and HCl, or a mixed solution comprising H$_2$O$_2$ and NH$_3$, the resultant surface of the substrate is subjected to wet etching, thereby permitting the WSiN layer 14 to remain and removing the tungsten nitride film 13.

As for the kind of the etching solution useful in this case, the etching solution is not necessarily limited to the aforementioned examples but may be optionally selected from those which are capable of selectively etching the tungsten nitride film 13 in preference to the WSiN layer 14. Furthermore, it is also possible to employ dry etching.

Then, as shown in FIG. 3K, by using the WSiN layer 14, the trench 5 is further filled, up to an intermediate depth thereof, with an n-type polycrystalline silicon film 15 which is employed for constituting part of the storage node electrode of a capacitor. This n-type polycrystalline silicon film 15 can be formed in the same manner as employed in the formation of the second n-type polycrystalline silicon film 12.

Then, as shown in FIG. 3L, a silicon oxide film 16 is deposited all over the surface so as to fill the opening 14 and the trench 5 with the silicon oxide film 16.

Then, as shown in FIG. 3M, by photolithography and etching, the portion of the silicon oxide film 16 that is disposed across the neighboring trench 5 is removed. Namely, the portion of the silicon oxide film 16 that is disposed over the element isolation region is removed.

Then, as shown in FIG. 3N, by using the silicon oxide film 16 as a mask, the silicon nitride film 3, the thin silicon oxide film 2, the p-type silicon substrate 1, the polycrystalline silicon film 15, the WSiN layer 14, the n-type polycrystalline silicon film 12 and the silicon oxide film 11 are etched away so as to form a shallow trench for element isolation (element isolation trench) 17. In this case, the depth of the element isolation trench 17 is set so as not to permit the bottom of the element isolation trench 17 to reach the first n-type polycrystalline silicon film 10.

Then, as shown in FIG. 3O, the silicon oxide film 16 is removed and a silicon oxide film 18 is deposited all over the resultant surface so as to fill the trench 17 with the silicon oxide film 18.

Then, as shown in FIG. 3P, the portion of the silicon oxide film 18 which is disposed outside the region of the element isolation trench 17 is removed, and at the same time, the silicon oxide film 18 and the silicon nitride film 3 are polished by a CMP process until the surfaces of the silicon oxide film 18 and the silicon nitride film 3 become flat and flush with each other.

Then, as shown in FIG. 3Q, by using heated phosphoric acid for instance, the silicon nitride film 3 is removed and then the silicon oxide film 2 is removed by using dilute HF for instance. On this occasion, part of the oxide film 18 is concurrently etched away. As a result, an element isolation (STI: Shallow Trench Isolation) constituted by the element isolation trench 17 filled with the silicon oxide film (element isolation insulating film) 18 can be formed.

Since the silicon oxide film 18 is subjected to etching in a washing treatment containing dilute HF which will be repeatedly performed in the manufacturing process, the thickness of the silicon oxide film 18 would be gradually reduced. Taking this phenomenon into consideration in advance, the magnitude of the CMP in the step of FIG. 3P is controlled to determine the height of the silicon oxide film 18 in the step of FIG. 3Q, thereby permitting the surface of the silicon oxide film 18 to have a desired height relative to the surface of the p-type silicon substrate 1 at the step of forming an MOS transistor.

Then, as shown in FIG. 3R, a p-type well 19 and a buried n-type well 20 are formed in the surface region of the p-type silicon substrate 1. Subsequently, a gate insulating film 21 is formed over the buried n-type well 20 and the element isolation insulating film 18.

The p-type well 19 and the buried n-type well 20 are formed in such a manner that the junction thereof is positioned at an intermediate portion of the silicon oxide film 11. Further, the buried n-type well 20 should be formed so as to enable it to electrically connect with the n-type diffusion layer (capacitor electrode) 8.

Then, as shown in FIG. 3S, gate electrodes 22 are formed and then, by using the gate electrodes 22 as a mask, an n-type impurity is ion-implanted into the surface of the p-type well 19. As for the material for forming the gate electrodes 22, it may be polycrystalline silicon, a laminate structure comprising polycrystalline silicon and metal silicide, or a laminate structure comprising polycrystalline silicon and metals. Furthermore, these structures for the gate electrodes 22 may be covered, on the top surface and the sidewalls thereof, with an insulating film. The resultant structure which has been ion-implanted in this manner is then subjected to annealing for activating the n-type impurity to form n-type source/drain diffusion layers 23, thus accomplishing an n-channel MOS transistor of memory cell. Among two n-type source/drain diffusion layers 23 of the n-channel MOS transistor, one which is disposed neighboring the WSiN layer 14 is electrically connected via this WSiN layer 14 with the n-type polycrystalline silicon film 12.

Thereafter, by of an ordinary DRAM-forming process, wirings and etc. are formed to accomplish a DRAM cell.

As explained above, according to the DRAM cell of this embodiment, the n-type polycrystalline silicon film 12 and the n-type source/drain diffusion layers 23 are electrically connected with each other through a connecting portion which is constituted by the n-type polycrystalline silicon film 12 and the WSiN layer 14.

Since the DRAM cell is constructed in this manner, the epitaxial growth of the n-type polycrystalline silicon film 12 to be initiated from the sidewall of the trench 5 (monocrystalline silicon) in the high-temperature heating step (the step of forming a passivation film) to be followed subsequent to the formation of the n-type polycrystalline silicon film 12 can be inhibited by the presence of the WSiN layer 14, thereby making it possible to prevent the generation of crystal defects in the p-type silicon substrate 1. As a result, it is possible to prevent the generation of a leak current that may be caused due to the generation of such crystal defects.

Additionally, since this WSiN layer 14 contains tungsten, this WSiN layer 14 is relatively low in electric resistance as compared with the silicon nitride film that has been conventionally employed as a connecting portion. As a result, it is now possible to suppress any increase in contact resistance between the WSiN layer 14 and the n-type source/drain diffusion layers 23, thereby making it possible to prevent the deterioration in operating speed of the memory.

Furthermore, since this WSiN layer 14 is low in electric resistance, this WSiN layer 14 is no longer required to be formed very small in thickness. As a result, it is now possible to overcome the conventional problems that may be caused to the non-uniformity in film thickness of the WSiN layer 14 such as the increase in contact resistance, and the increase in non-uniformity of the contact resistance among the memory cells.

The present invention should not be construed as being limited to the aforementioned embodiments. For example, it is possible in the aforementioned embodiment to employ a polycrystalline germanium film or a polycrystalline germanium silicon film for the polycrystalline semiconductor film for constituting the aforementioned connecting portion.

The present invention will be very effectively utilized in a case where a trench capacitor is electrically connected with a p-channel MOS transistor, and will be also applicable to a CMOS (dual gate).

Figure 4:
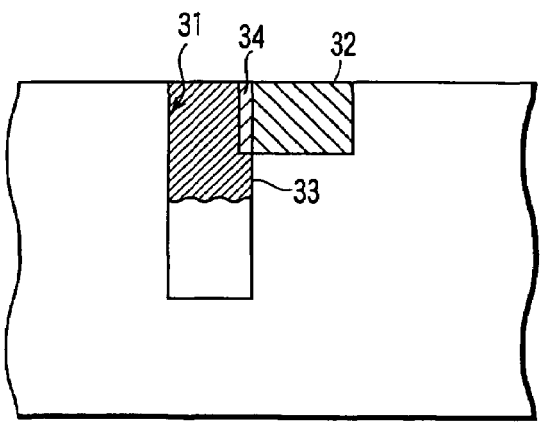
FIG. 4 is a cross-sectional view illustrating another embodiment of the present invention.

As shown in FIG. 4, this embodiment of the present invention can be applied to any kind of structure where the diffusion layer (monocrystalline semiconductor) 32 disposed on the sidewall of the trench 31 is electrically connected with the polycrystalline semiconductor film 33. Due to the interposition of the metal semiconductor nitride layer 34 between them, the monocrystallization of the polycrystalline semi-conductor film 33 during a high-temperature heat treatment in a subsequent step can be effectively prevented irrespective of the kind of semiconductor element involved therein. In this case, there is no particular limitation with regard to the underlying structure of the polycrystalline semiconductor film 33.

It is also possible to form one or two poly-crystalline silicon films, or to form four or more polycrystalline silicon films in the trench to form a structure where the polycrystalline silicon films formed inside the trench are enabled to electrically connect with a diffusion layer disposed on the surface region of substrate through the aforementioned metal semiconductor nitride layer.

Additionally, the embodiments mentioned above may be variously modified and practiced within the spirit of the present invention.

As explained above, according to the embodiments of the present invention, it is possible to provide a semiconductor device and a manufacturing method thereof that avoid the generation of epitaxial growth of a polycrystalline semiconductor film formed inside a trench so as to be electrically connected with a diffusion layer formed on the surface of a semi-conductor substrate, and to prevent any increase in contact resistance between the polycrystalline semiconductor film and the diffusion layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:
    forming a trench on a surface of a substrate;
    filling said trench with a first polycrystalline semiconductor film in such a degree that said trench is not completely filled with said first polycrystalline semiconductor film up to the top of opening of said trench;
    depositing a metal nitride film to cover a portion of sidewall of said trench which is not yet filled with said first polycrystalline semiconductor film;
    heat-treating the sidewall of said trench and said metal nitride film which is contacted with said sidewall to permit a reaction to take place between them to convert said metal nitride film contacting with the sidewall of said trench into a metal semiconductor nitride layer comprising metal and nitrogen included in said metal nitride film, and a semiconductor constituting said semiconductor substrate;
    removing said metal nitride film while permitting said metal semiconductor nitride layer to be left remain;
    depositing a second polycrystalline semiconductor film in said trench; and
    forming a diffusion layer on a surface region of said substrate, said diffusion layer being electrically connected, via said metal semiconductor nitride layer, with said second polycrystalline semiconductor film.

2. The method according to claim 1, wherein a metal included in said metal semiconductor nitride layer is selected from those which exhibit a smaller degree of drop in Gibbs free energy on an occasion of forming a nitride thereof than a magnitude of drop in Gibbs free energy which the semiconductor constituting said semiconductor substrate would exhibit on the occasion of forming a nitride thereof.

3. The method for manufacturing a semiconductor device according to claim 1, wherein said metal semiconductor nitride layer is amorphous in structure.

4. The method according to claim 1, wherein the semiconductor constituting the semiconductor substrate is silicon, and the metal included in said metal semiconductor nitride layer is selected from the group consisting of tungsten, molybdenum and chromium.

5. The method according to claim 1, which said heat treatment is performed in a non-oxidizing atmosphere.

6. The method according to claim 1, wherein said semiconductor substrate is formed of a monocrystalline substrate.

7. A method of manufacturing a semiconductor device comprising:
    forming a trench on a surface of a substrate;
    depositing an insulating film to cover a sidewall and bottom of said trench;
    filling said trench with a first polycrystalline semiconductor film in such a degree that said trench is not completely filled with said first polycrystalline semiconductor film up to the top of opening of said trench;
    removing a portion of said insulating film covering a portion of the sidewall of said trench which is not buried by said first polycrystalline semiconductor film;
    depositing a metal nitride film to cover a portion of sidewall of said trench which has been exposed due to the removal of said insulating film;
    heat-treating the sidewall of said trench and said metal nitride film which is contacted with said sidewall to permit a reaction to take place between them to convert said metal nitride film contacting with the sidewall of said trench into a metal semiconductor nitride layer comprising metal and nitrogen included in the said metal nitride film, and a semiconductor constituting said semiconductor substrate;
    removing said metal nitride film while permitting said metal semiconductor nitride layer to be left remain;
    depositing a second polycrystalline semiconductor film in said trench; and
    forming a first diffusion layer on a surface region of said substrate, said first diffusion layer being electrically connected, via said metal semiconductor nitride layer, with said second polycrystalline semiconductor film.

8. The method according to claim 7, further comprising forming a second insulating film in a region of said semiconductor substrate around said trench prior to covering the sidewall and bottom of said trench with said insulating film.

9. The method according to claim 7, wherein a metal included in said metal semiconductor nitride layer is selected from those which exhibit a smaller degree of drop in Gibbs free energy on an occasion of forming a nitride thereof than a magnitude of drop in Gibbs free energy which the semiconductor constituting the semiconductor substrate would exhibit on the occasion of forming a nitride thereof.

10. The method for manufacturing a semiconductor device according to claim 7, wherein said metal semiconductor nitride layer is amorphous in structure.

11. The method according to claim 7, wherein the semiconductor constituting the semiconductor substrate is silicon, and the metal included in said metal semiconductor nitride layer is selected from the group consisting of tungsten, molybdenum and chromium.

12. The method according to claim 7, wherein said heat treatment is performed in a non-oxidizing atmosphere.

13. The method according to claim 7, wherein said semiconductor substrate is formed of a monocrystalline substrate.

* * * * *